(12) United States Patent
Lin et al.

(10) Patent No.: US 9,240,384 B2
(45) Date of Patent: Jan. 19, 2016

(54) SEMICONDUCTOR DEVICE WITH SOLDER BUMP FORMED ON HIGH TOPOGRAPHY PLATED CU PADS

(71) Applicant: STATS ChipPAC, Ltd., Singapore (SG)

(72) Inventors: Yaojian Lin, Singapore (SG); Qing Zhang, Singapore (SG); Haijing Cao, Singapore (SG)

(73) Assignee: STATS ChipPAC, Ltd., Singapore (SG)

(*) Notice: Subject to any disclaimer, the term of this patent is extended or adjusted under 35 U.S.C. 154(b) by 0 days.

(21) Appl. No.: 13/621,804

(22) Filed: Sep. 17, 2012

(65) Prior Publication Data

US 2013/0015575 A1     Jan. 17, 2013

Related U.S. Application Data

(60) Continuation of application No. 12/700,114, filed on Feb. 4, 2010, now Pat. No. 8,304,904, which is a division of application No. 11/689,282, filed on Mar. 21, 2007, now Pat. No. 7,682,959.

(51) Int. Cl.
*H01L 21/44* (2006.01)
*H01L 23/48* (2006.01)
(Continued)

(52) U.S. Cl.
CPC ............... *H01L 24/11* (2013.01); *H01L 24/03* (2013.01); *H01L 24/05* (2013.01);
(Continued)

(58) Field of Classification Search
CPC .............. H01L 2924/00014; H01L 2924/00; H01L 2224/48091; H01L 2224/16225; H01L 24/03; H01L 24/11; H01L 24/05; H01L 2224/11019; H01L 2224/0231; H01L 2224/03912; H01L 2224/0401; H01L 2224/05647; H01L 2224/11009; H01L 2224/13022; H01L 2224/131; H01L 2224/16; H01L 2224/13109; H01L 2224/05567; H01L 2224/05548; H01L 2224/13099; H01L 2924/01013; H01L 2924/01014; H01L 2924/01022; H01L 2924/01028; H01L 2924/01029; H01L 2924/01049; H01L 2924/0105; H01L 2924/01073; H01L 2924/01074; H01L 2924/01075; H01L 2924/01079; H01L 2924/01082; H01L 2924/01322; H01L 2924/01327; H01L 2924/014; H01L 2924/04953; H01L 2924/05042; H01L 2924/14; H01L 2924/01033; H01L 2924/01024; H01L 2924/01023; H01L 2924/01006; H01L 2924/00013
USPC .......... 257/737, 738, 778, 779, 780, E23.021, 257/E23.033, E23.069; 438/612, 613
See application file for complete search history.

(56) References Cited

U.S. PATENT DOCUMENTS 5,693,565 A * 12/1997 Camilletti et al. ............... 438/17
6,396,148 B1    5/2002 Eichelberger et al.
(Continued)

*Primary Examiner* — Teresa M Arroyo
(74) *Attorney, Agent, or Firm* — Robert D. Atkins; Patent Law Group: Atkins and Associates, P.C.

(57) ABSTRACT

A semiconductor device has a first conductive layer formed over a substrate. A first insulating layer is formed over the substrate and first conductive layer. A second conductive layer is formed over the first conductive layer and first insulating layer. A second insulating layer is formed over the first insulating layer and second conductive layer. The second insulating layer has a sidewall between a surface of the second insulating material and surface of the second conductive layer. A protective layer is formed over the second insulating layer and surface of the second conductive layer. The protective layer follows a contour of the surface and sidewall of the second insulating layer and second conductive layer. A bump is formed over the surface of the second conductive layer and a portion of the protective layer adjacent to the second insulating layer. The protective layer protects the second insulating layer.

16 Claims, 4 Drawing Sheets

(51) Int. Cl.
  *H01L 23/52* (2006.01)
  *H01L 29/40* (2006.01)
  *H01L 23/00* (2006.01)

(52) U.S. Cl.
  CPC .......... *H01L 2224/0231* (2013.01); *H01L 2224/03912* (2013.01); *H01L 2224/0401* (2013.01); *H01L 2224/05548* (2013.01); *H01L 2224/05567* (2013.01); *H01L 2224/05647* (2013.01); *H01L 2224/11009* (2013.01); *H01L 2224/11019* (2013.01); *H01L 2224/131* (2013.01); *H01L 2224/13022* (2013.01); *H01L 2224/13109* (2013.01); *H01L 2224/16* (2013.01); *H01L 2924/0002* (2013.01); *H01L 2924/00013* (2013.01); *H01L 2924/00014* (2013.01); *H01L 2924/014* (2013.01); *H01L 2924/0105* (2013.01); *H01L 2924/01006* (2013.01); *H01L 2924/01013* (2013.01); *H01L 2924/01014* (2013.01); *H01L 2924/01022* (2013.01); *H01L 2924/01023* (2013.01); *H01L 2924/01024* (2013.01); *H01L 2924/01028* (2013.01); *H01L 2924/01029* (2013.01); *H01L 2924/01033* (2013.01); *H01L 2924/01049* (2013.01); *H01L 2924/01073* (2013.01); *H01L 2924/01074* (2013.01); *H01L 2924/01075* (2013.01); *H01L 2924/01079* (2013.01); *H01L 2924/01082* (2013.01); *H01L 2924/01322* (2013.01); *H01L 2924/01327* (2013.01); *H01L 2924/04953* (2013.01); *H01L 2924/05042* (2013.01); *H01L 2924/14* (2013.01)

(56) References Cited

U.S. PATENT DOCUMENTS

| | | | |
|---|---|---|---|
| 6,451,681 B1 * | 9/2002 | Greer | 438/601 |
| 6,555,459 B1 * | 4/2003 | Tokushige et al. | 438/612 |
| 6,583,039 B2 | 6/2003 | Chen et al. | |
| 6,590,295 B1 | 7/2003 | Liao et al. | |
| 6,656,828 B1 * | 12/2003 | Maitani et al. | 438/613 |
| 6,689,680 B2 * | 2/2004 | Greer | 438/614 |
| 6,713,381 B2 * | 3/2004 | Barr et al. | 438/622 |
| 6,853,076 B2 | 2/2005 | Datta et al. | |
| 6,930,354 B2 | 8/2005 | Shirai et al. | |
| 7,056,818 B2 * | 6/2006 | Yang | 438/612 |
| 2002/0105076 A1 | 8/2002 | Lin | |
| 2002/0180064 A1 | 12/2002 | Hwan et al. | |
| 2002/0185749 A1 | 12/2002 | Farnworth | |
| 2003/0025202 A1 * | 2/2003 | Mikagi et al. | 257/737 |
| 2003/0073300 A1 | 4/2003 | Chen et al. | |
| 2003/0104183 A1 | 6/2003 | Narizuka et al. | |
| 2003/0134496 A1 * | 7/2003 | Lee et al. | 438/612 |
| 2004/0092092 A1 * | 5/2004 | Yang | 438/612 |
| 2004/0092126 A1 | 5/2004 | Yang et al. | |
| 2004/0188851 A1 * | 9/2004 | Takewaki et al. | 257/774 |
| 2004/0245630 A1 * | 12/2004 | Huang et al. | 257/737 |
| 2004/0253801 A1 * | 12/2004 | Lin | 438/612 |
| 2005/0001313 A1 * | 1/2005 | Yang | 257/734 |
| 2005/0020047 A1 | 1/2005 | Mis et al. | |
| 2005/0067711 A1 | 3/2005 | Opheim | |
| 2005/0164483 A1 | 7/2005 | Jeong et al. | |
| 2006/0125072 A1 | 6/2006 | Mihara | |
| 2006/0125117 A1 | 6/2006 | Hashimoto | |
| 2006/0138671 A1 | 6/2006 | Watanabe | |
| 2006/0220247 A1 | 10/2006 | Hanaoka | |
| 2006/0231951 A1 | 10/2006 | Jan et al. | |
| 2007/0007659 A1 | 1/2007 | Narayan et al. | |
| 2007/0015351 A1 * | 1/2007 | Tomimori et al. | 438/612 |
| 2007/0023925 A1 * | 2/2007 | Ke et al. | 257/779 |
| 2009/0117702 A1 * | 5/2009 | Lin et al. | 438/381 |
| 2014/0183761 A1 * | 7/2014 | Lin et al. | 257/787 |

\* cited by examiner

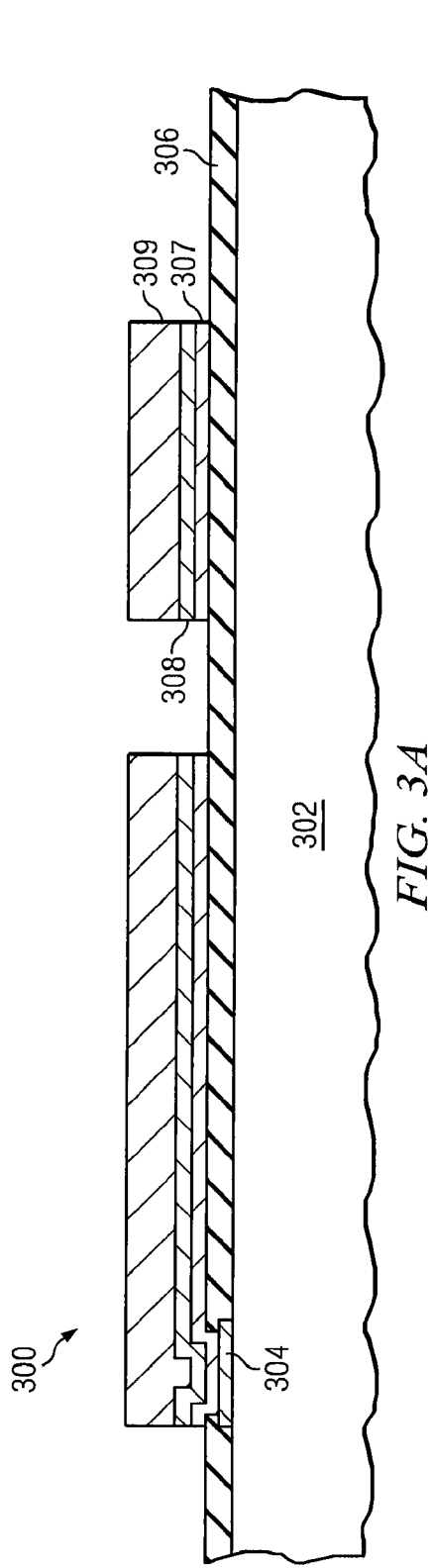
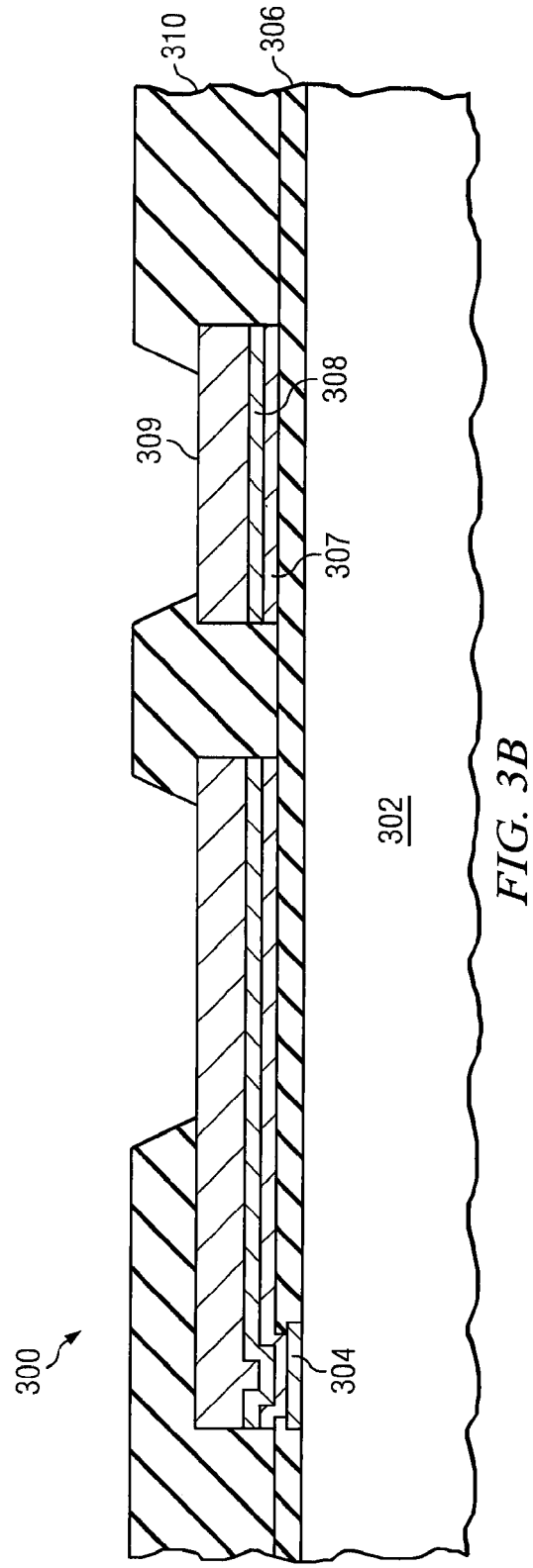
FIG. 3A
FIG. 3B

SEMICONDUCTOR DEVICE WITH SOLDER BUMP FORMED ON HIGH TOPOGRAPHY PLATED CU PADS

CLAIM TO DOMESTIC PRIORITY

The present application is a continuation of U.S. patent application Ser. No. 12/700,114, now U.S. Pat. No. 8,304,904, filed Feb. 4, 2010, which is a division of U.S. patent application Ser. No. 11/689,282, filed Mar. 21, 2007, now, U.S. Pat. No. 7,682,959, which applications are incorporated herein.

FIELD OF THE INVENTION

The present invention relates in general to semiconductor devices and, more particularly, to a semiconductor device having a solder bump formed on high-topography electroplated copper pads.

BACKGROUND OF THE INVENTION

Semiconductors, or computer chips, are found in virtually every electrical product manufactured today. Chips are used not only in very sophisticated industrial and commercial electronic equipment, but also in many household and consumer items such as televisions, clothes washers and dryers, radios, and telephones. As products become smaller but more functional, there is a need to include more chips in the smaller products to perform the functionality. The reduction in size of cellular telephones is one example of how more and more capabilities are incorporated into smaller and smaller electronic products.

Ball Grid Array (hereinafter referred to as BGA) packaging is widely applied to package the integrated circuits of chip sets or graphic chips, etc. Conventionally, the BGA packaging has tin balls provided on the bottom surface of a substrate and arranged in a form of an array. The balls serve as the leads or pins (conductive media) between a chip (or IC) and a circuit board, replacing the conventional lead frames. The BGA packaging can provide not only more pins but also more space between every two adjacent pins than that of conventional packaging, under the same size of substrate. In addition, BGA packaging provides superior heat dissipation and electrical conductivity by providing shorter conducting paths between the chip and the circuit board.

According to the raw material of the substrate, BGA substrates are divided into three categories: Plastic BGA (PBGA), Metal BGA (MBGA), and Tape BGA (TBGA). The PBGA substrate is made of organic materials such as compounds of BT resin and glass fiber. It is the most popular BGA substrate in the packaging industry.

To meet the need for shrinking package sizes and growing lead counts, flip chip and ball grid array (BGA) technologies have become increasingly popular. Flip chip relates to the attachment of an integrated circuit to a substrate while BGA relates to the attachment of a substrate to a printed circuit board or the like. Flip chip BGA packages (FCBGA), which combine the two technologies, are relatively small and have relatively high lead counts.

One conventional method of creating components of such wafer level package structures is shown in FIG. 1. A plurality of input/output 202 are disposed on a semiconductor substrate 201, and are used to transmit input or output signals. The input/output 202 are usually made of metal, such as gold (Au), aluminum (Al), or copper (Cu). The semiconductor substrate 201 and the input/output 202 are both covered by a passivation layer 203. The passivation layer 203 is usually made of oxide, (such as silicon dioxide ($SiO_2$)), nitride (such as silicon nitride ($Si_3N_4$)), or other organic compounds (such as polyimide (PI)). The passivation layer 203 covers the semiconductor structure so as to protect circuits on the semiconductor structure 201.

A series of metal protection layers 204a, 204b, and 205 are used to protect the passivation layer 203 from damage. An under bump metallurgy layer (UBM layer) 206 is deposited on the protection layer 205. The under bump metallurgy layer 206 is usually made of copper (Cu), CuNi, gold (Au), or alloy, and is used as an adhesion layer for the metal solder bump 207. The metal solder bump 207 is located over the under bump metallurgy layer 206, and are usually made of conductive materials which can be used in electroplating technology, such as Sn/Pb alloy, copper (Cu), gold (Au), nickel (Ni), or indium (In).

In the manufacturing process involving high-topography, electroplated copper (Cu) pads, passivation material such as passivation layer 203 tends to crack. Hence, the prior art use of protection layers 204a, 204b, and 205 is implemented as a possible solution to protect the passivation layer 203. In addition, polyimide (PI)/copper (Cu) interfaces typically located at the bottom of a via are attacked during the solder bumping process. Such protective measures as found in the prior art, however, are expensive and involve extra manufacturing steps which create additional manufacturing time and complexity in the manufacturing process.

SUMMARY OF THE INVENTION

In light of the foregoing, a need exists for a manufacturing method involving solder bumping, where associated passivation material is protected, yet manufacturing costs, time and complexities are reduced.

In one embodiment, the present invention is a method of making a semiconductor device comprising the steps of providing a substrate, forming a first conductive layer over the substrate, forming a first insulating layer over the substrate and first conductive layer, forming an opening in the first insulating layer to expose the first conductive layer, forming a protective layer over the first insulating layer including into the opening of the first insulating layer, and forming a bump over the first conductive layer and protective layer to isolate the bump from the first insulating layer.

In another embodiment, the present invention is a method of making a semiconductor device comprising the steps of providing a substrate, forming a first insulating layer over the substrate, forming a protective layer over the first insulating layer, and forming an interconnect structure over the protective layer to isolate the interconnect structure from the first insulating layer.

In another embodiment, the present invention is a method of making a semiconductor device comprising the steps of providing a substrate, forming an interconnect structure over the substrate, forming a protective layer over the interconnect structure, and forming a bump over the protective layer to electrically connect the bump to a first portion of the interconnect structure and isolate the bump from a second portion of the interconnect structure.

In another embodiment, the present invention is a semiconductor device comprising a substrate and interconnect structure formed over the substrate. A protective layer is formed over the interconnect structure. A bump is formed over the protective layer. The bump is electrically connected to a first portion of the interconnect structure and isolated from a second portion of the interconnect structure.

BRIEF DESCRIPTION OF THE DRAWINGS

FIG. 3A illustrates an example first step in a manufacturing process;

FIG. 3B illustrates an example second step in a manufacturing process;

DETAILED DESCRIPTION OF THE DRAWINGS

Figure 1:
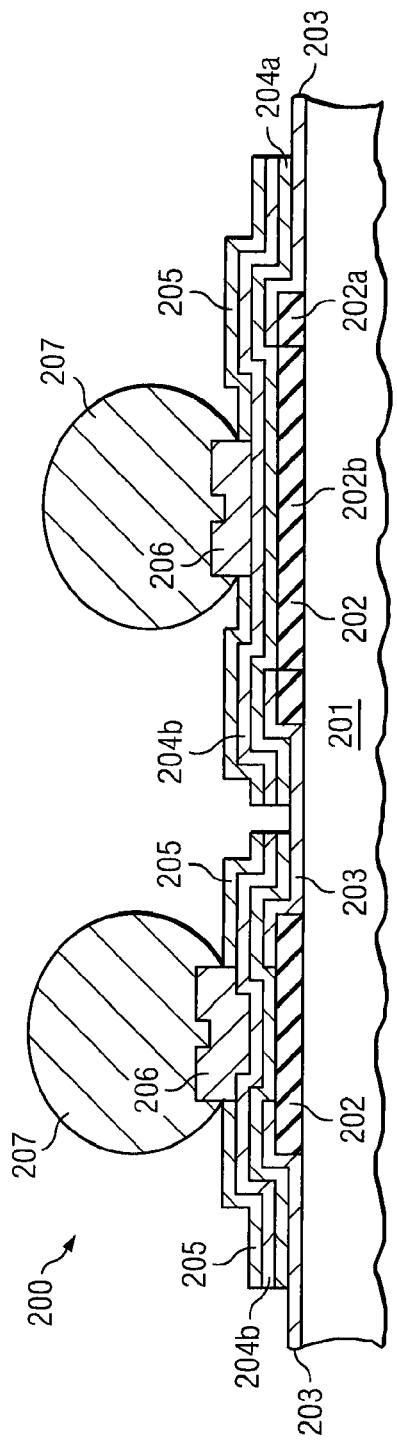
FIG. 1 illustrates an example prior art semiconductor device having a series of protective metal layers formed over a passivation layer to protect the passivation layer.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

A flip-chip semiconductor package with a lead frame is a combination of the lead frame serving as a chip carrier and a flip-chip structure in which a semiconductor chip is mounted on the lead frame in a flip-chip manner. Such semiconductor packages include the lead frame having a plurality of leads, or having a plurality of leads and a die pad; at least one chip, which is mounted and electrically connected to the leads via a plurality of solder bumps formed on an active surface of the chip, or which is mounted on the die pad and electrically connected to the leads via a plurality of solder bumps formed on the active surface of the chip; and an encapsulation body for encapsulating the lead frame, the chip and the solder bumps. Flip chip packaging technology provides an advantage that the solder bumps are self-aligned and can be completely bonded to the leads in a single process, which thereby is relatively more time and labor-effective, unlike a conventional wiring method by which a plurality of bonding wires for the electrical connection between chip and leads need to be formed one by one.

Since the solder bumps are usually made of tin (Sn) 63/lead (Pb) 37 alloy, and the lead frame is made of a solderable metal such as copper, during a reflow process for soldering the solder bumps to the leads, the solder bumps under a particular high temperature melt and collapse to form eutectic, thus resulting in an intermetallic compound between the solder bumps and the leads, and which is customarily referred to as a wetting step.

Semiconductor structures having electroplated copper (Cu) pad structures can be incorporated into such flip chip semiconductor devices, or can be fabricated for other similar devices or to suit a particular application.

Electroplated copper (Cu) pad structures can be thicker than aluminum structures, generally above 5 microns in thickness. In some manufacturing processes, materials such as polyimide are disposed above the copper structures. As a next step in some manufacturing processes, dry film stripping techniques are then used. The dry film stripping process can include strong solvents, which tend to crack materials such as polyimide, particularly at the junction of the copper pad.

A semiconductor device incorporating high-topography electroplated copper (Cu) pad structures can be manufactured with a technique as follows which serves to protect the passivation surface during the solder bumping process. In addition, the polyimide/copper (Pi/Cu) interface located at the bottom portion of the via is protected from fluxing chemicals attacking the interface during a solder reflow manufacturing process.

Figure 2:
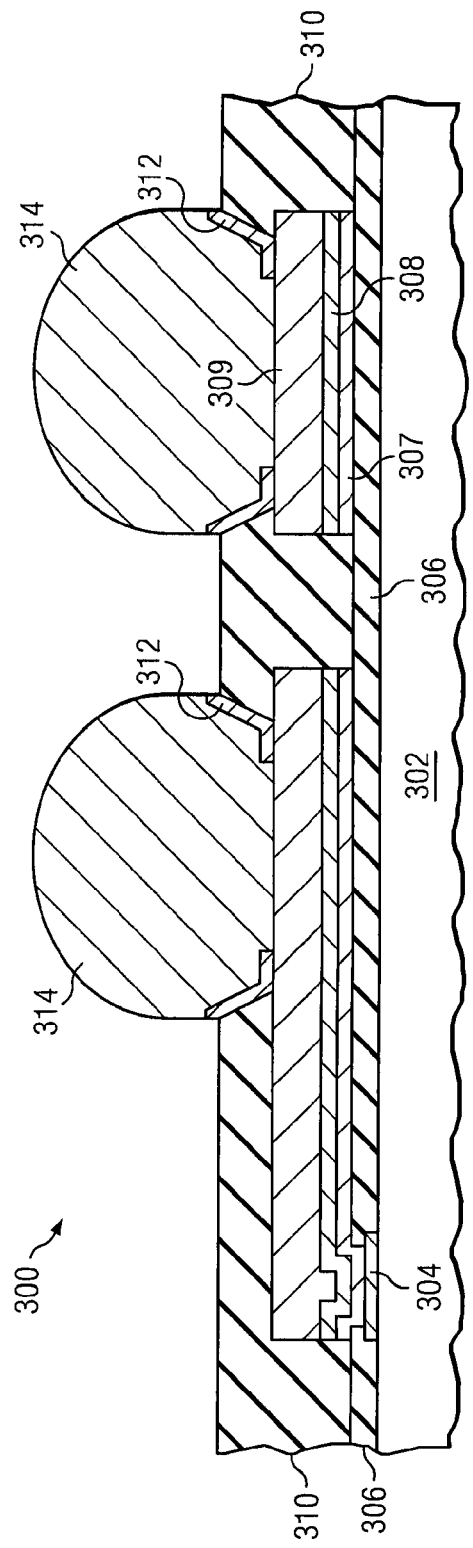
FIG. 2 illustrates an example semiconductor device.

Turning to FIG. 2, an example semiconductor device 300 having incorporated high-topography electroplated copper (Cu) pad structures is presented which can be manufactured using techniques according to the present invention. Device 300 includes a substrate 302. An input/output (I/O) pad 304 is disposed over the substrate to promote electrical connectivity to the substrate.

A first passivation layer 306 is disposed over a portion of the pad 304 and the remainder of the substrate 302 as shown. Electroplated copper (Cu) structures such as copper layer 309 are disposed over the first passivation layer, along with an adhesion layer 307 and an optional barrier layer 308, depending on the thickness of Cu layer 309. Layers 307, 308 and 309 can form a Cu runner structure. The Cu runner 307, 308, 309 conducts electrical current from the via to the pad 304. A second passivation layer 310 is disposed over the layer 309.

In accordance with the present invention, a portion of a sacrifice layer 312 is shown on opposing sides of a solder ball 314 which is formed in vias of device 300 as shown. The sacrifice layer 312 is used during the manufacturing process to protect the passivation material, such as polyimide, from damage. At a later stage in the manufacturing process, the sacrifice layer 312 can be removed to re-expose the passivation material. In one embodiment, the sacrifice layer 312 is removed after either dry film/flux stripping. In another embodiment, the sacrifice layer 312 is removed after the completion of a solder bumping process, with the solder bumps used as a hard mask. In either case, the passivation/copper junction at the bottom of each via is protected from flux solvents attacking the junction during a solder reflow process.

Turning to FIG. 3A, an example first step of manufacturing device 300 is shown according to the present invention. At the depicted stage shown in FIG. 3A, device 300 includes a Cu runner 309 (redistribution layer) which is deposited and patterned on a first passivation layer 306. Again, layer 306 is deposited on a substrate 302 for structural support, and incorporates an I/O pad 304 to provide electrical connectivity. A Cu runner structure, which can include an adhesion layer 307, an optional barrier layer 308, and a Cu layer 309 is deposited on the first passivation layer 306. Again, the barrier layer 308 is optional and depends upon the thickness of the CU layer 309.

The adhesion layer 307 can be made of titanium (Ti), titanium/tungsten (TiW), tantalum (Ta), chromium (Cr), or a metal with similar properties. The thickness of the adhesion layer 307 can vary between 200 Angstroms to 1500 Angstroms.

Barrier layer 308 can include nickel-vanadium (NiV), chromium-copper (CrCu), tantalum nitride (TaN), or a similar metal or metal alloy. The thickness of the barrier layer can range from 400 Angstroms to 4000 Angstroms.

Turning to FIG. 3B, an example second step of manufacturing device 300 is depicted. A second passivation layer 310 is deposited and patterned over a portion of the Cu runner 307, 308, 309 and a portion of the first passivation layer 306 as shown. Layer 310 can include polyimide, benzocyclobutene (BCB), lead oxide (PbO), or similar materials.

Figure 3C:
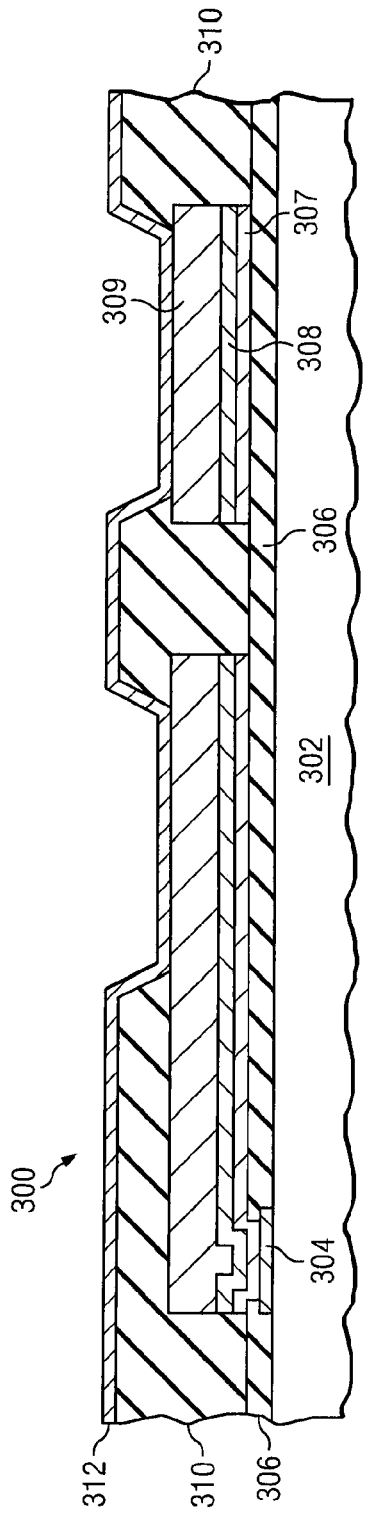
FIG. 3C illustrates an example third step in a manufacturing process.
Figure 3D:
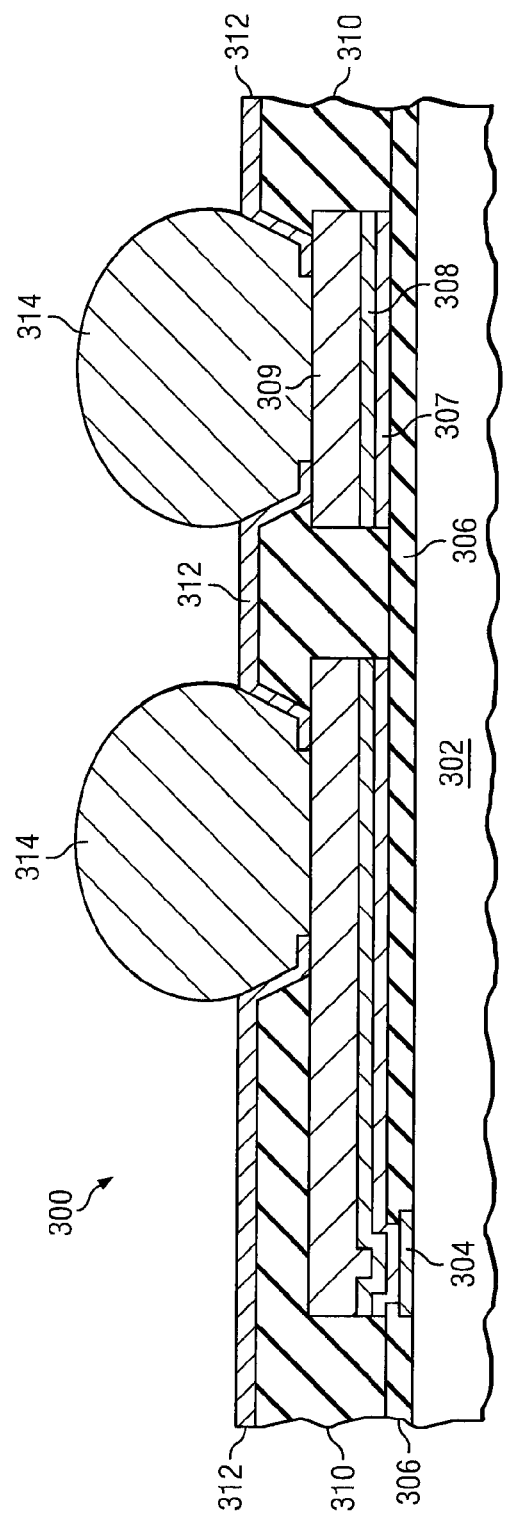
FIG. 3D illustrates an example fourth step in a manufacturing process.
Figure 3E:
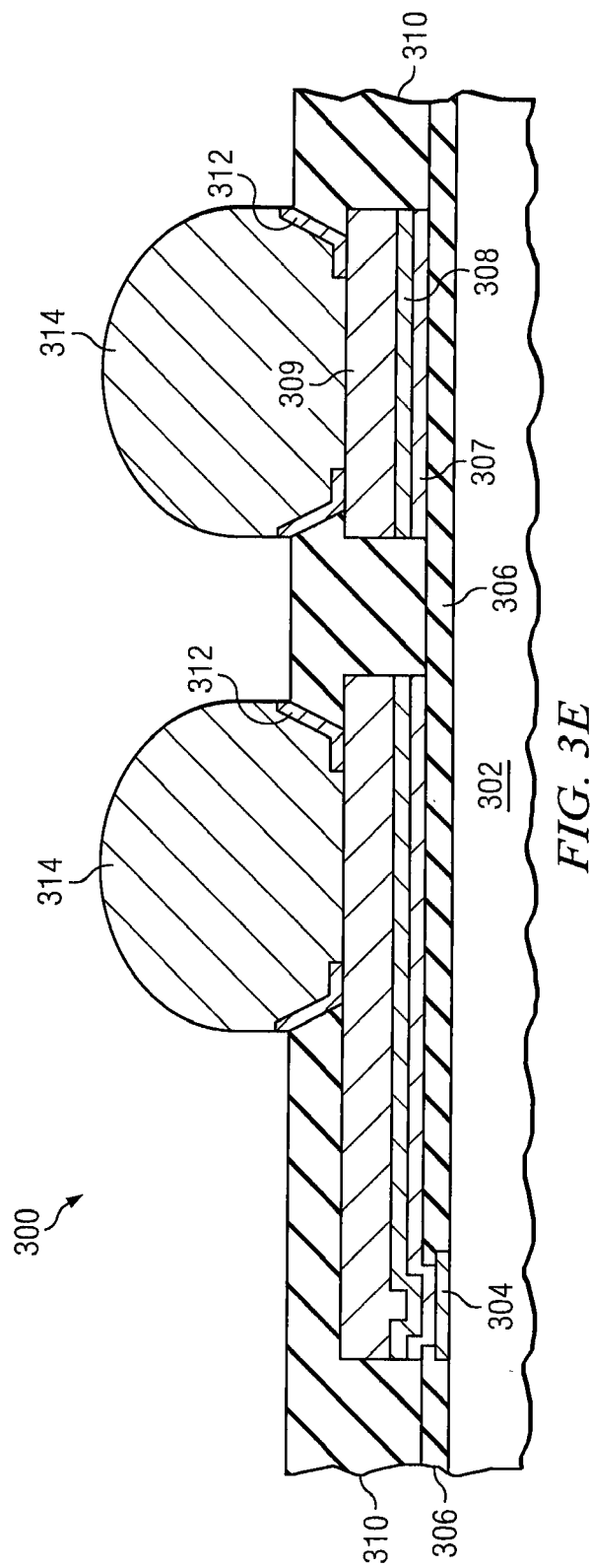
FIG. 3E illustrates an example fifth step in a manufacturing process.

At the depicted stage shown in FIG. 3C, device 300 consists of the substrate layer 302, the I/O pad 304 formed over the substrate, the first passivation layer 306 formed over a portion of the pad 304 and substrate 302, copper runners having layers 307, 308, and 309 formed over the layer 306, a second passivation layer 310 formed over the structures 308, and a sacrifice layer 312 which is initially formed over a portion of the copper layers 307, 308, and 309 and second passivation layer 310.

Sacrifice layer 312 is deposited and patterned to protect the passivation surface 310 during the solder bumping process. As shown, sacrifice layer 312 covers and protects the passivation layer 310. The sacrifice layer 312 can include such materials as titanium (Ti), titanium-tungsten (TiW), tantalum (Ta), silicon nitride ($Si_3N_4$), silicon dioxide ($SiO_2$), a silicide, or similar materials.

As a next step, the sacrifice layer 312 is patterned with lithography. An opening is etched or otherwise formed in a portion of the layer 312 to expose a surface of the copper layers 309 and provide electrical connectivity. A pair of solder bumps 314 are then formed in the vias of device 300 as shown in FIG. 3B. During the solder bumping process, the layer 312 acts to protect the passivation material 310 from cracking.

A portion of the sacrifice layer 312 which resides outside the contact of the solder balls 314 and the layer 310 is then removed after either one of two processes. The portion of the sacrifice layer 312 can be removed after a dry film/flux stripping process. In addition, the portion of the sacrifice layer 312 can be removed after the completing of an entire solder bumping manufacturing process, using the solder bumps 314 as a hard mask. The sacrifice layer 312 can be removed using a dry etching or wet etching manufacturing process.

Following the removal process, the portion of the layer 312 between the solder balls 314 and the layer 310 remains, partly to provide structural support. The portion of the layer 312 which lays outside of the solder zone is removed. A next step of manufacturing can then be undertaken for a particular application.

The semiconductor manufacturing techniques previously described can be carried out with tools and materials which are known in the art, such as the use of patterning or etching equipment. Implementation of a manufacturing technique such as the example method described provides an inexpensive, yet effective method of preserving passivation material during the solder bumping process. In addition, the polyimide/copper (Pi/Cu) interface located at the bottom of the via is protected from fluxing chemicals attacking the surfaces during a solder reflow manufacturing process.

Semiconductor devices 300 serve to continue to advance semiconductor technology at reduced fabrication cost, while resulting in larger overall repeatable quality. Devices 300 eliminate the need to fabricate a series of protective metal layers to protect a passivation material during the solder bumping process. In addition, the need to form an UBM structure is alleviated. Both innovations significantly lower manufacturing cost, time, and complexity.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   forming a first conductive layer over the substrate;
   forming a first insulating layer over the substrate and first conductive layer;
   forming an opening in the first insulating layer extending to the first conductive layer while leaving a surface of the first insulating layer in contact with and overlapping along a surface of the first conductive layer opposite the substrate as a junction between the first insulating layer and first conductive layer;
   forming a protective layer over the first insulating layer including into the opening of the first insulating layer;
   forming a bump over the first conductive layer and protective layer, wherein the protective layer isolates the bump from the junction between the first conductive layer and the first insulating layer; and
   removing the protective layer outside the bump after forming the bump.

2. The method of claim 1, further including:
   forming a second conductive layer over the substrate;
   forming a second insulating layer over the substrate and second conductive layer; and
   forming a third conductive layer over the second conductive layer and second insulating layer.

3. The method of claim 2, further including forming a fourth conductive layer over the third conductive layer, wherein the first conductive layer is formed over the fourth conductive layer.

4. The method of claim 1, wherein the protective layer includes an insulating material or conductive material.

5. The method of claim 1, wherein the protective layer includes a material selected from the group consisting of silicon nitride, silicon dioxide, silicide, titanium, titanium-tungsten, and tantalum.

6. A method of making a semiconductor device, comprising:
   providing a substrate;
   forming a first insulating layer over the substrate;
   forming a protective layer over an entire surface of the first insulating layer;
   forming an interconnect structure over an opening in the protective layer and isolated from the first insulating layer; and
   removing a first portion of the protective layer outside the interconnect structure after forming the interconnect structure while retaining a second portion of the protective layer between the interconnect structure and first insulating layer.

7. The method of claim 6, further including forming a first conductive layer over the substrate prior to forming the first insulating layer.

8. The method of claim 7, further including forming an opening in the first insulating layer extending to the first conductive layer, wherein the protective layer is formed over the first insulating layer including into the opening of the first insulating layer.

9. The method of claim 7, further including:
   forming a second conductive layer over the substrate;
   forming a second insulating layer over the substrate and second conductive layer; and
   forming a third conductive layer over the second conductive layer and second insulating layer.

10. The method of claim 6, wherein the interconnect structure includes a bump.

11. The method of claim 6, wherein the protective layer includes an insulating material or conductive material.

12. A method of making a semiconductor device, comprising:
   providing a substrate;
   forming a first conductive layer over the substrate;
   forming a first insulating layer over the substrate and first conductive layer;
   forming a protective layer over the first insulating layer;
   forming a bump over an opening in the protective layer and electrically connected to the first conductive layer and isolated from the first insulating layer; and
   removing a portion of the protective layer outside the bump after forming the bump.

13. The method of claim 12, further including forming an opening in the first insulating layer extending to the first conductive layer, wherein the protective layer is formed over the first insulating layer including into the opening of the first insulating layer.

14. The method of claim 12, further including:
   forming a second conductive layer over the substrate;
   forming a second insulating layer over the substrate and second conductive layer; and
   forming a third conductive layer over the second conductive layer and second insulating layer.

15. The method of claim 12, further including forming the opening in the protective layer over the first conductive layer.

16. The method of claim 12, wherein the protective layer includes an insulating material or conductive material.

* * * * *